United States Patent
Sun et al.

(10) Patent No.: US 9,299,472 B2
(45) Date of Patent: Mar. 29, 2016

(54) COPPER-ALLOY BARRIER LAYERS FOR METALLIZATION IN THIN-FILM TRANSISTORS AND FLAT PANEL DISPLAYS

(71) Applicants: Shuwei Sun, Framingham, MA (US); Francois-Charles Dary, Newton, MA (US); Marc Abouaf, Harvard, MA (US); Patrick Hogan, Somerville, MA (US); Qi Zhang, Wellesley, MA (US)

(72) Inventors: Shuwei Sun, Framingham, MA (US); Francois-Charles Dary, Newton, MA (US); Marc Abouaf, Harvard, MA (US); Patrick Hogan, Somerville, MA (US); Qi Zhang, Wellesley, MA (US)

(73) Assignee: H.C. Starck Inc., Newton, MA (US)

(*) Notice: Subject to any disclaimer, the term of this patent is extended or adjusted under 35 U.S.C. 154(b) by 0 days.

(21) Appl. No.: 14/296,796

(22) Filed: Jun. 5, 2014

(65) Prior Publication Data

US 2014/0363933 A1 Dec. 11, 2014

Related U.S. Application Data

(60) Provisional application No. 61/831,865, filed on Jun. 6, 2013.

(51) Int. Cl.
*H01L 21/84* (2006.01)
*H01B 1/02* (2006.01)
*H01L 29/66* (2006.01)
*G06F 3/041* (2006.01)
*H01L 29/49* (2006.01)

(52) U.S. Cl.
CPC ............... *H01B 1/026* (2013.01); *G06F 3/041* (2013.01); *H01L 29/4908* (2013.01); *H01L 29/6675* (2013.01)

(58) Field of Classification Search
CPC ................. H01L 29/6675; H01L 29/4908
See application file for complete search history.

(56) References Cited

U.S. PATENT DOCUMENTS

| | | | |
|---|---|---|---|
| 6,326,287 B1 * | 12/2001 | Asahina | H01L 21/28518 257/750 |
| 2009/0166640 A1 | 7/2009 | Han et al. | |
| 2011/0020970 A1 * | 1/2011 | Caiger | 438/57 |
| 2013/0032793 A1 | 2/2013 | Kim et al. | |
| 2013/0135224 A1 | 5/2013 | Lee et al. | |
| 2013/0200382 A1 * | 8/2013 | Kim et al. | 257/59 |
| 2014/0362307 A1 | 12/2014 | Sun et al. | |

FOREIGN PATENT DOCUMENTS

| | | |
|---|---|---|
| KR | 2000-0056517 A | 9/2000 |
| WO | 2010/013636 A1 | 2/2010 |
| WO | 2014/197661 A1 | 12/2014 |

OTHER PUBLICATIONS

PCT International Application No. PCT/US2014/041026, International Search Report and Written Opinion mailed on Oct. 16, 2014, 17 pages.

* cited by examiner

*Primary Examiner* — Richard Booth
(74) *Attorney, Agent, or Firm* — Morgan, Lewis & Bockius LLP

(57) ABSTRACT

In various embodiments, electronic devices such as thin-film transistors incorporate electrodes featuring a conductor layer and, disposed below the conductor layer, a barrier layer comprising an alloy of Cu and one or more refractory metal elements selected from the group consisting of Ta, Nb, Mo, W, Zr, Hf, Re, Os, Ru, Rh, Ti, V, Cr, and Ni.

22 Claims, 13 Drawing Sheets

AS DEPOSITED

300°C/1h

500°C/1h

SEM

TEM

COPPER-ALLOY BARRIER LAYERS FOR METALLIZATION IN THIN-FILM TRANSISTORS AND FLAT PANEL DISPLAYS

RELATED APPLICATION

This application claims the benefit of and priority to U.S. Provisional Patent Application No. 61/831,865, filed Jun. 6, 2013, the entire disclosure of which is hereby incorporated herein by reference.

TECHNICAL FIELD

In various embodiments, the present invention relates to the metallization of electronic devices such as flat panel displays and touch panel displays, in particular to capping and barrier layers for such metallization.

BACKGROUND

Flat panel displays have rapidly become ubiquitous in various markets, and are now commonly utilized in a variety of appliances, televisions, computers, cellular phones, and other electronic devices. One example of a commonly used flat panel display is the thin film transistor (TFT) liquid crystal display (LCD), or TFT-LCD. A typical TFT-LCD contains an array of TFTs each controlling the emission of light from a pixel or sub-pixel of an LCD. FIG. 1A depicts the cross-section of a conventional TFT 100 as might be found in a TFT-LCD. As shown, the TFT 100 includes a gate electrode 105 formed on a glass substrate 110. A gate insulator 115 electrically insulates the gate electrode 105 from overlying conductive structures. An active layer 120, typically composed of amorphous silicon, conducts charge between a source electrode 125 and a drain electrode 130, under the electrical control of gate electrode 105, and the conducted charge controls the operation of the pixel or sub-pixel connected thereto (not shown). A source/drain insulator 132 electrically isolates the source electrode 125 from the drain electrode 130 and protectively seals the TFT 100. As shown, each of the gate electrode 105, source electrode 125, and drain electrode 130 typically include a barrier metal layer 135 and a metal conductor layer 140 thereover. The barrier 135 provides good adhesion between the conductor 140 and the underlying glass and/or silicon and reduces or prevents diffusion therebetween.

Over time, LCD panel sizes have increased and TFT-based pixel sizes have decreased, placing increasingly high demands on the conductors within the TFT-LCD structure. In order to decrease the resistance in the conductors and thereby increase electrical signal propagation speeds in the TFT-LCD, manufacturers are now utilizing low-resistivity metals such as copper (Cu) for the conductors 140 within the display. Metals such as molybdenum (Mo), titanium (Ti), or molybdenum-titanium alloys (Mo—Ti) have been utilized for barriers 135 underlying Cu conductors 140; however, these metals suffer from one or more deficiencies that limit the performance of the TFT-LCD and/or present difficulties in the fabrication process for the TFT-LCD. For example, some conventional barriers 135 have relatively high resistivity and therefore compromise the overall conductivity of the electrodes. Furthermore, as shown in FIG. 1B, during the etching of electrodes such as gate electrodes 105, either a residue 145 (of one or both electrode materials) or etch discontinuities 150, e.g., stepped or nonlinear profiles (caused by non-uniform etch rates of the two different electrode materials), may result.

Similarly, touch-panel displays are becoming more common in electronic devices, and they may even be utilized in tandem with TFT-LCDs. A typical touch-panel display includes an array of sensors arranged in rows and columns and that sense a touch (or close proximity) of, e.g., a finger, via capacitive coupling. FIG. 2A schematically depicts an exemplary sensor array 200 for a touch-panel display that includes multiple conductive column sensors 210 that are interconnected to form columns 220, as well as multiple conductive row sensors 230 that are interconnected to form rows 240. The sensors 210, 230 are formed over a substrate 250 and are electrically coupled to a processor 260 that both senses the changes in capacitive coupling that represent "touches" and provides these signals to other electronic components within a device (e.g., a computer or mobile computing device that incorporates a touch screen). The sensors 210, 230 may be formed of a transparent conductor such as indium tin oxide (ITO), and the substrate 250 may be glass or any other suitably rigid (and/or transparent) support material.

FIG. 2B depicts a magnified perspective view of a point within the sensor array 200 where the interconnected column sensors 210 intersect the interconnected row sensors 230. In order to avoid electrical shorting between the columns 220 and the rows 240 (see FIG. 2A), the interconnections between column sensors 210 are isolated from the underlying or overlying row sensors 230. For example, as shown in FIG. 2B, an insulator layer 270 is disposed between the column 220 of column sensors 210 and a conductive interconnect (or "bridge") 280 that electrically connects the row sensors 230 within a row 240. As shown in FIG. 2C, the interconnects 280 are typically composed of an Al conductive layer 290 with an overlying barrier or capping layer 295 that is typically composed of Mo, Ti, or Mo—Ti. The capping layer 295 helps to prevent diffusion from the conductive layers 290 and protects conductive layers 290 from corrosion during processing and product use. The capping layer 295 may also improve adhesion to overlying layers. However, as described above for TFT-LCDs, the metals conventionally used for the capping layer 295 metals from one or more deficiencies that limit performance and/or present difficulties in the fabrication process. For example, the capping layers 295 may have relatively high resistivity and therefore compromise the overall conductivity of the interconnects 280, degrading electrical performance. Furthermore, as shown in FIG. 2D, during the etching of the interconnects 280, either a residue 296 (of one or both of conductive layer 290 or capping layer 295) or etch discontinuities 297, e.g., stepped or nonlinear profiles (caused by non-uniform etch rates of the two different materials), may result.

In view of the foregoing, there is a need for barrier and/or capping metal layers for electronic devices such as TFT-LCDs and touch-panel displays that provide excellent adhesion to underlying substrates, prevent diffusion of the conductor metal into nearby layers, protect the conductor metal from corrosion, and are uniformly etched with the underlying or overlying conductor metals during fabrication.

SUMMARY

In accordance with various embodiments of the present invention, electronic devices such as TFT-LCDs and touch-panel displays, and the metallic interconnects and electrodes therein, are fabricated utilizing capping and/or barrier layers including or consisting essentially of an alloy of Cu and one or more refractory metal elements such as tantalum (Ta), niobium (Nb), Mo, tungsten (W), zirconium (Zr), hafnium (Hf), rhenium (Re), osmium (Os), ruthenium (Ru), rhodium (Rh), Ti, vanadium (V), chromium (Cr), or nickel (Ni). The one or more refractory elements may be present in the alloy at weight concentrations of 1-50 percent. In an exemplary implementation, alloy barrier layers are formed directly on substrate layers such as glass and/or silicon-based layers, and conductor layers including or consisting essentially of highly conductive metals such as Cu, silver (Ag), aluminum (Al), or gold (Au) are formed thereover to form the various electrodes in a TFT structure. In another exemplary implementation, highly conductive metals such as Cu, Ag, Al, and/or Au are utilized as conductive interconnects in a touch-panel display and are capped with protecting capping layers that include or consist essentially of an alloy of Cu and one or more refractory metal elements such as Ta, Nb, Mo, W, Zr, Hf, Re, Os, Ru, Rh, Ti, V, Cr, or Ni. The one or more refractory elements may be present in the alloy at weight concentrations of 1-50 percent (hereafter weight %).

Surprisingly, even though the barrier and capping layers are predominantly Cu, the presence of the refractory-metal alloying element(s) discourages or even prevents the diffusion of Cu into nearby layers, e.g., an underlying silicon layer, approximately as well as pure Mo barrier layers when utilized with Cu conductor layers. While not wishing to be bound by any particular theory or mechanism for this phenomenon, the refractory-metal alloying element may react with atoms of the silicon layer to form silicide regions that occupy grain boundaries in the barrier or capping metal and thereby prevent diffusion of Cu into the substrate (or other adjoining layer) along the grain boundaries, which would otherwise be fast diffusion paths.

In various embodiments, the barrier and/or capping layer includes or consists essentially of an alloy of Cu with (i) Ta and Cr, (ii) Ta and Ti, or (iii) Nb and Cr. For example, the barrier and/or capping layer may include (i) 1 weight %-12 weight % Ta (preferably approximately 5 weight % Ta) and 1 weight %-5 weight % Cr (preferably approximately 2 weight % Cr), (ii) 1 weight %-12 weight % Ta (preferably approximately 5 weight % Ta) and 1 weight %-5 weight % Ti (preferably approximately 2 weight % Ti), or (iii) 1 weight %-10 weight % Nb (preferably approximately 5 weight % Nb) and 1 weight %-5 weight % Cr (preferably approximately 2 weight % Cr). Furthermore, when utilized in conjunction with highly conductive conductor layers such as Cu to form electrodes and/or interconnects, the barrier and/or capping layer and the conductor layer exhibit substantially identical etch rates in preferred etchants such as a PAN etch, i.e., a mixture of phosphoric acid, acetic acid, and nitric acid, which may be mixed with water and may be heated to elevated temperatures. Thus, etch-related residue and discontinuities are minimized or eliminated via use of the barrier and/or capping layers in accordance with preferred embodiments of the present invention.

In an aspect, embodiments of the invention feature a thin-film transistor that includes or consists essentially of a substrate and an electrode. The substrate may include or consist essentially of silicon and/or glass. The electrode includes or consists essentially of (i) disposed over or on the substrate, a barrier layer that includes, consists essentially of, or consists of an alloy of Cu and one or more refractory metal elements selected from the list consisting of Ta, Nb, Mo, W, Zr, Hf, Re, Os, Ru, Rh, Ti, V, Cr, and Ni, and (ii) disposed over or on the barrier layer, a conductor layer that includes, consists essentially of, or consists of Cu, Ag, Al, and/or Au.

Embodiments of the invention may include one or more of the following in any of a variety of different combinations. The substrate may include, consist essentially of, or consist of glass. The substrate may include, consist essentially of, or consist of silicon, e.g., amorphous silicon. The barrier layer may include, consist essentially of, or consist of an alloy of Cu, Ta, and Cr. The barrier layer may include, consist essentially of, or consist of 1 weight %-12 weight % Ta, 1 weight %-5 weight % Cr, and the balance Cu. The barrier layer may include, consist essentially of, or consist of approximately 5 weight % Ta, approximately 2 weight % Cr, and the balance Cu. The barrier layer may include, consist essentially of, or consist of 5 weight % Ta, 2 weight % Cr, and the balance Cu. The barrier layer may include, consist essentially of, or consist of approximately 2 weight % Ta, approximately 1 weight % Cr, and the balance Cu. The barrier layer may include, consist essentially of, or consist of 2 weight % Ta, 1 weight % Cr, and the balance Cu.

The barrier layer may include, consist essentially of, or consist of an alloy of Cu, Ta, and Ti. The barrier layer may include, consist essentially of, or consist of 1 weight %-12 weight % Ta, 1 weight %-5 weight % Ti, and the balance Cu. The barrier layer may include, consist essentially of, or consist of approximately 5 weight % Ta, approximately 2 weight % Ti, and the balance Cu. The barrier layer may include, consist essentially of, or consist of 5 weight % Ta, 2 weight % Ti, and the balance Cu.

The barrier layer may include, consist essentially of, or consist of an alloy of Cu, Nb, and Cr. The barrier layer may include, consist essentially of, or consist of 1 weight %-10 weight % Nb, 1 weight %-5 weight % Cr, and the balance Cu. The barrier layer may include, consist essentially of, or consist of approximately 5 weight % Nb, approximately 2 weight % Cr, and the balance Cu. The barrier layer may include, consist essentially of, or consist of 5 weight % Nb, 2 weight % Cr, and the balance Cu.

The electrode may include a sidewall including, consisting essentially of, or consisting of (a) an exposed portion of the barrier layer, (b) an exposed portion of the conductor layer, and (c) an interface between the exposed portion of the barrier layer and the exposed portion of the conductor layer. The sidewall of the electrode may be substantially, or even entirely, free of discontinuities notwithstanding the interface. The substrate may be substantially, or even entirely, free of Cu diffusion from the barrier layer. The barrier layer may include, consist essentially of, or consist of a plurality of crystalline grains separated by grain boundaries. At least one of the grain boundaries may include a particulate therein. The particulate may include, consist essentially of, or consist of a reaction product of silicon and at least one of the refractory metal elements.

In another aspect, embodiments of the invention feature a method of forming an electrode of a thin-film transistor. A substrate is provided. The substrate may include, consist essentially of, or consist of silicon and/or glass. A barrier layer is deposited over the substrate, and a conductor layer is deposited over the barrier layer. The barrier layer includes, consists essentially of, or consists of an alloy of Cu and one or more refractory metal elements selected from the group consisting of Ta, Nb, Mo, W, Zr, Hf, Re, Os, Ru, Rh, Ti, V, Cr, and Ni. The conductor layer includes, consists essentially of, or consists of Cu, Ag, Al, and/or Au. A mask layer is formed over the barrier layer, and the mask layer is patterned to reveal a portion of the conductor layer. A remaining portion of the mask layer may at least partially define a shape of the electrode. An etchant is applied to remove portions of the conductor layer and the barrier layer not masked by the patterned mask layer, thereby forming a sidewall of the electrode. The sidewall includes, consists essentially of, or consists of (a) an exposed portion of the barrier layer, (b) an exposed portion of the conductor layer, and (c) an interface between the exposed portion of the barrier layer and the exposed portion of the conductor layer. The sidewall is substantially, or even entirely, free of discontinuities notwithstanding the interface.

Embodiments of the invention may include one or more of the following in any of a variety of different combinations. The mask layer may include, consist essentially of, or consist of photoresist. The etchant may include, consist essentially of, or consist of a mixture of phosphoric acid, acetic acid, nitric acid, and water. The etchant may include, consist essentially of, or consist of 50-60 weight % phosphoric acid, 15-25 weight % acetic acid, 3-5 weight % nitric acid, and the balance water. The etchant may include, consist essentially of, or consist of 50 weight % phosphoric acid, 25 weight % acetic acid, 3 weight % nitric acid, and the balance water. The remaining portion of the patterned mask layer may be removed, e.g., after the etchant is applied. The barrier layer may include, consist essentially of, or consist of a plurality of crystalline grains separated by grain boundaries. The substrate may include, consist essentially of, or consist of silicon. The electrode may be annealed at a temperature sufficient to form a particulate within at least one of the grain boundaries (e.g., between 200° C. and 700° C., or between 300° C. and 500° C.). The particulate may include, consist essentially of, or consist of a reaction product of silicon and at least one of the refractory metal elements (e.g., a refractory metal silicide). The substrate may include, consist essentially of, or consist of glass or amorphous silicon.

The barrier layer may include, consist essentially of, or consist of an alloy of Cu, Ta, and Cr. The barrier layer may include, consist essentially of, or consist of 1 weight %-12 weight % Ta, 1 weight %-5 weight % Cr, and the balance Cu. The barrier layer may include, consist essentially of, or consist of approximately 5 weight % Ta, approximately 2 weight % Cr, and the balance Cu. The barrier layer may include, consist essentially of, or consist of 5 weight % Ta, 2 weight % Cr, and the balance Cu. The barrier layer may include, consist essentially of, or consist of approximately 2 weight % Ta, approximately 1 weight % Cr, and the balance Cu. The barrier layer may include, consist essentially of, or consist of 2 weight % Ta, 1 weight % Cr, and the balance Cu.

The barrier layer may include, consist essentially of, or consist of an alloy of Cu, Ta, and Ti. The barrier layer may include, consist essentially of, or consist of 1 weight %-12 weight % Ta, 1 weight %-5 weight % Ti, and the balance Cu. The barrier layer may include, consist essentially of, or consist of approximately 5 weight % Ta, approximately 2 weight % Ti, and the balance Cu. The barrier layer may include, consist essentially of, or consist of 5 weight % Ta, 2 weight % Ti, and the balance Cu.

The barrier layer may include, consist essentially of, or consist of an alloy of Cu, Nb, and Cr. The barrier layer may include, consist essentially of, or consist of 1 weight %-10 weight % Nb, 1 weight %-5 weight % Cr, and the balance Cu. The barrier layer may include, consist essentially of, or consist of approximately 5 weight % Nb, approximately 2 weight % Cr, and the balance Cu. The barrier layer may include, consist essentially of, or consist of 5 weight % Nb, 2 weight % Cr, and the balance Cu.

In yet another aspect, embodiments of the invention feature a touch-panel display that includes or consists essentially of a substrate, a plurality of conductive touch-panel row sensors, a plurality of conductive touch-panel column sensors, and an interconnect. The row sensors are disposed over the substrate and arranged in lines extending along a first direction. The column sensors are disposed over the substrate and arranged in lines extending along a second direction and intersecting the lines of the row sensors. The interconnect is disposed at a point of intersection between a line of row sensors and a line of column sensors, and the interconnect electrically connects two column sensors or two row sensors. The interconnect includes, consists essentially of, or consists of (i) a conductor layer that includes, consists essentially of, or consists of Cu, Ag, Al, and/or Au, and (ii) disposed over or on the conductor layer, a capping layer that includes, consists essentially of, or consists of an alloy of Cu and one or more refractory metal elements selected from the list consisting of Ta, Nb, Mo, W, Zr, Hf, Re, Os, Ru, Rh, Ti, V, Cr, and Ni.

Embodiments of the invention may include one or more of the following in any of a variety of different combinations. The interconnect may extend over or under a row sensor and electrically connect two column sensors. An insulating layer may be disposed between the interconnect and the row sensor and may electrically insulate the interconnect and the row sensor. The interconnect may extend over or under a column sensor and electrically connect two row sensors. An insulating layer may be disposed between the interconnect and the column sensor and may electrically insulate the interconnect and the column sensor. The substrate may include, consist essentially of, or consist of an insulating material, e.g., glass. The row sensors and/or the column sensors may include, consist essentially of, or consist of a substantially transparent conductive material, e.g., indium tin oxide.

The capping layer may include, consist essentially of, or consist of an alloy of Cu, Ta, and Cr. The capping layer may include, consist essentially of, or consist of 1 weight %-12 weight % Ta, 1 weight %-5 weight % Cr, and the balance Cu. The capping layer may include, consist essentially of, or consist of approximately 5 weight % Ta, approximately 2 weight % Cr, and the balance Cu. The capping layer may include, consist essentially of, or consist of 5 weight % Ta, 2 weight % Cr, and the balance Cu. The capping layer may include, consist essentially of, or consist of approximately 2 weight % Ta, approximately 1 weight % Cr, and the balance Cu. The capping layer may include, consist essentially of, or consist of 2 weight % Ta, 1 weight % Cr, and the balance Cu.

The capping layer may include, consist essentially of, or consist of an alloy of Cu, Ta, and Ti. The capping layer may include, consist essentially of, or consist of 1 weight %-12 weight % Ta, 1 weight %-5 weight % Ti, and the balance Cu. The capping layer may include, consist essentially of, or consist of approximately 5 weight % Ta, approximately 2 weight % Ti, and the balance Cu. The capping layer may include, consist essentially of, or consist of 5 weight % Ta, 2 weight % Ti, and the balance Cu.

The capping layer may include, consist essentially of, or consist of an alloy of Cu, Nb, and Cr. The capping layer may include, consist essentially of, or consist of 1 weight %-10 weight % Nb, 1 weight %-5 weight % Cr, and the balance Cu. The capping layer may include, consist essentially of, or consist of approximately 5 weight % Nb, approximately 2 weight % Cr, and the balance Cu. The capping layer may include, consist essentially of, or consist of 5 weight % Nb, 2 weight % Cr, and the balance Cu.

The interconnect may include a sidewall that includes, consists essentially of, or consists of (a) an exposed portion of the capping layer, (b) an exposed portion of the conductor layer, and (c) an interface between the exposed portion of the capping layer and the exposed portion of the conductor layer. The sidewall of the electrode may be substantially, or even entirely free of discontinuities notwithstanding the interface. The capping layer may include, consist essentially of, or consist of a plurality of crystalline grains separated by grain boundaries. At least one of the grain boundaries may include a particulate therein. The particulate may include, consist essentially of, or consist of an agglomeration (e.g., an aggregation of atoms coming together via diffusion) of one or more of the refractory metal elements. One or more of the grain boundaries may contain a larger concentration of the refractory metal element(s) than the bulk volumes of the grains of the capping layer.

In another aspect, embodiments of the invention feature a method of forming an interconnect of a touch-panel display. A structure including or consisting essentially of a substrate, a plurality of conductive touch-panel row sensors, and a plurality of conductive touch-panel column sensors is provided. The row sensors are disposed over the substrate and arranged in lines extending along a first direction. The column sensors are disposed over the substrate and arranged in lines extending along a second direction and intersecting the lines of the row sensors. An insulator layer is deposited at least at a point of intersection between a line of row sensors and a line of column sensors. A conductor layer is deposited over the insulator layer, and a capping layer is deposited over or on the conductor layer. The conductor layer includes, consists essentially of, or consists of Cu, Ag, Al, and/or Au. The capping layer includes, consists essentially of, or consists of an alloy of Cu and one or more refractory metal elements selected from the group consisting of Ta, Nb, Mo, W, Zr, Hf, Re, Os, Ru, Rh, Ti, V, Cr, and Ni. A mask layer is formed over the capping layer. The mask layer is patterned to reveal a portion of the capping layer. A remaining portion of the mask layer may at least partially define a shape of the interconnect. An etchant is applied to remove portions of the capping layer and the conductor layer not masked by the patterned mask layer, thereby forming a sidewall of the interconnect. The sidewall includes, consists essentially of, or consists of (a) an exposed portion of the capping layer, (b) an exposed portion of the conductor layer, and (c) an interface between the exposed portion of the capping layer and the exposed portion of the conductor layer. The sidewall is substantially, or even entirely, free of discontinuities notwithstanding the interface.

Embodiments of the invention may include one or more of the following in any of a variety of different combinations. The mask layer may include, consist essentially of, or consist of photoresist. The etchant may include, consist essentially of, or consist of a mixture of phosphoric acid, acetic acid, nitric acid, and water. The etchant may include, consist essentially of, or consist of 50-60 weight % phosphoric acid, 15-25 weight % acetic acid, 3-5 weight % nitric acid, and the balance water. The etchant may include, consist essentially of, or consist of 50 weight % phosphoric acid, 25 weight % acetic acid, 3 weight % nitric acid, and the balance water. Any remaining portion of the patterned mask layer may be removed. The capping layer may include, consist essentially of, or consist of a plurality of crystalline grains separated by grain boundaries. The interconnect may be annealed at a temperature sufficient to form a particulate within at least one of the grain boundaries (e.g., between 200° C. and 700° C., or between 300° C. and 500° C.). The particulate may include, consist essentially of, or consist of an agglomeration of at least one of the refractory metal elements. The substrate may include, consist essentially of, or consist of an insulating material, e.g., glass. The row sensors and column sensors may include, consist essentially of, or consist of a substantially transparent conductive material, e.g., indium tin oxide.

The capping layer may include, consist essentially of, or consist of an alloy of Cu, Ta, and Cr. The capping layer may include, consist essentially of, or consist of 1 weight %-12 weight % Ta, 1 weight %-5 weight % Cr, and the balance Cu. The capping layer may include, consist essentially of, or consist of approximately 5 weight % Ta, approximately 2 weight % Cr, and the balance Cu. The capping layer may include, consist essentially of, or consist of 5 weight % Ta, 2 weight % Cr, and the balance Cu. The capping layer may include, consist essentially of, or consist of approximately 2 weight % Ta, approximately 1 weight % Cr, and the balance Cu. The capping layer may include, consist essentially of, or consist of 2 weight % Ta, 1 weight % Cr, and the balance Cu.

The capping layer may include, consist essentially of, or consist of an alloy of Cu, Ta, and Ti. The capping layer may include, consist essentially of, or consist of 1 weight %-12 weight % Ta, 1 weight %-5 weight % Ti, and the balance Cu. The capping layer may include, consist essentially of, or consist of approximately 5 weight % Ta, approximately 2 weight % Ti, and the balance Cu. The capping layer may include, consist essentially of, or consist of 5 weight % Ta, 2 weight % Ti, and the balance Cu.

The capping layer may include, consist essentially of, or consist of an alloy of Cu, Nb, and Cr. The capping layer may include, consist essentially of, or consist of 1 weight %-10 weight % Nb, 1 weight %-5 weight % Cr, and the balance Cu. The capping layer may include, consist essentially of, or consist of approximately 5 weight % Nb, approximately 2 weight % Cr, and the balance Cu. The capping layer may include, consist essentially of, or consist of 5 weight % Nb, 2 weight % Cr, and the balance Cu.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean ±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of multiple metals will generally include only those metals and only unintentional impurities (which may be metallic or non-metallic) that may be detectable via chemical analysis but do not contribute to function. As used herein, "consisting essentially of at least one metal" refers to a metal or a mixture of two or more metals but not compounds between a metal and a non-metallic element or chemical species such as oxygen or nitrogen (e.g., metal nitrides or metal oxides); such non-metallic elements or chemical species may be present, collectively or individually, in trace amounts, e.g., as impurities. As used herein, "columns" and "rows" refer to elements arranged in different directions (and that may intersect), and are otherwise arbitrary unless otherwise noted; i.e., an arrangement of elements may be a row or a column, regardless of its orientation in space or within a device. As used herein, "substrate" or "base layer" refers to a support member (e.g., a semiconductor substrate such as silicon, GaAs, GaN, SiC, sapphire, or InP, or a platform including or consisting essentially of another material, e.g., an insulating material such as glass) with or without one or more additional layers disposed thereon, or to the one or more additional layers themselves.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which:

(FIG. 9B), and after annealing at 500° C. (FIG. 9C), in accordance with various embodiments of the invention;

DETAILED DESCRIPTION

Figure 1A:
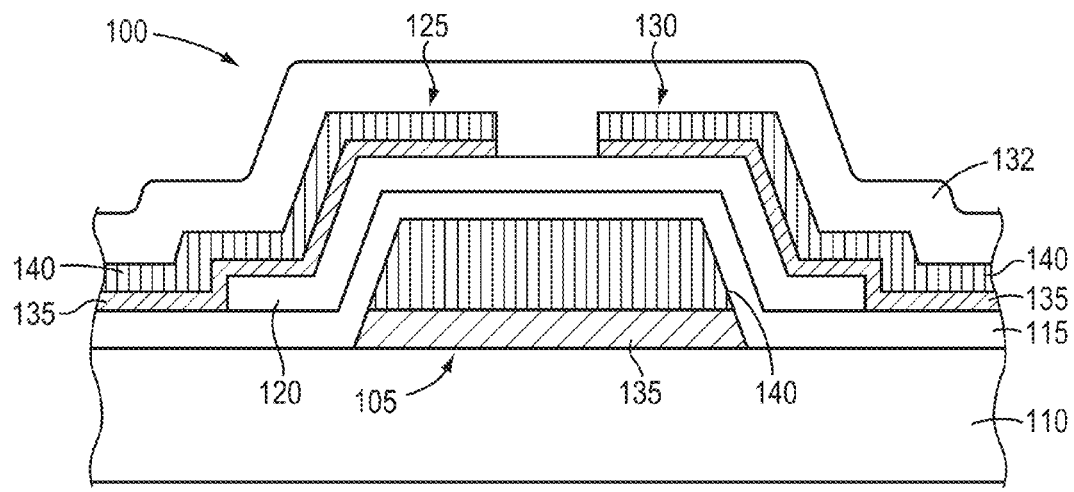
FIG. 1A is a schematic cross-section of a thin-film transistor for a liquid crystal display.
Figure 1B:
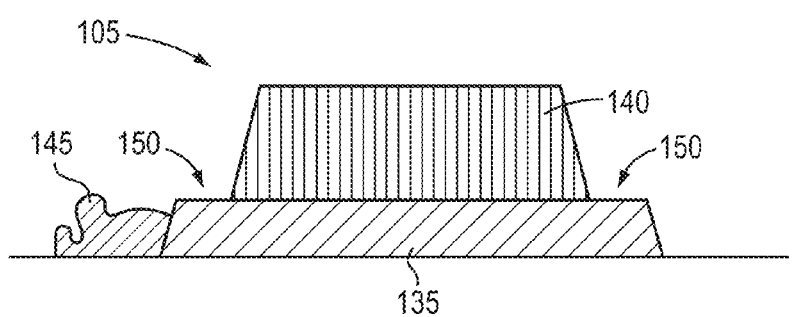
FIG. 1B is a schematic cross-section of an etched conventional TFT electrode.
Figure 2A:
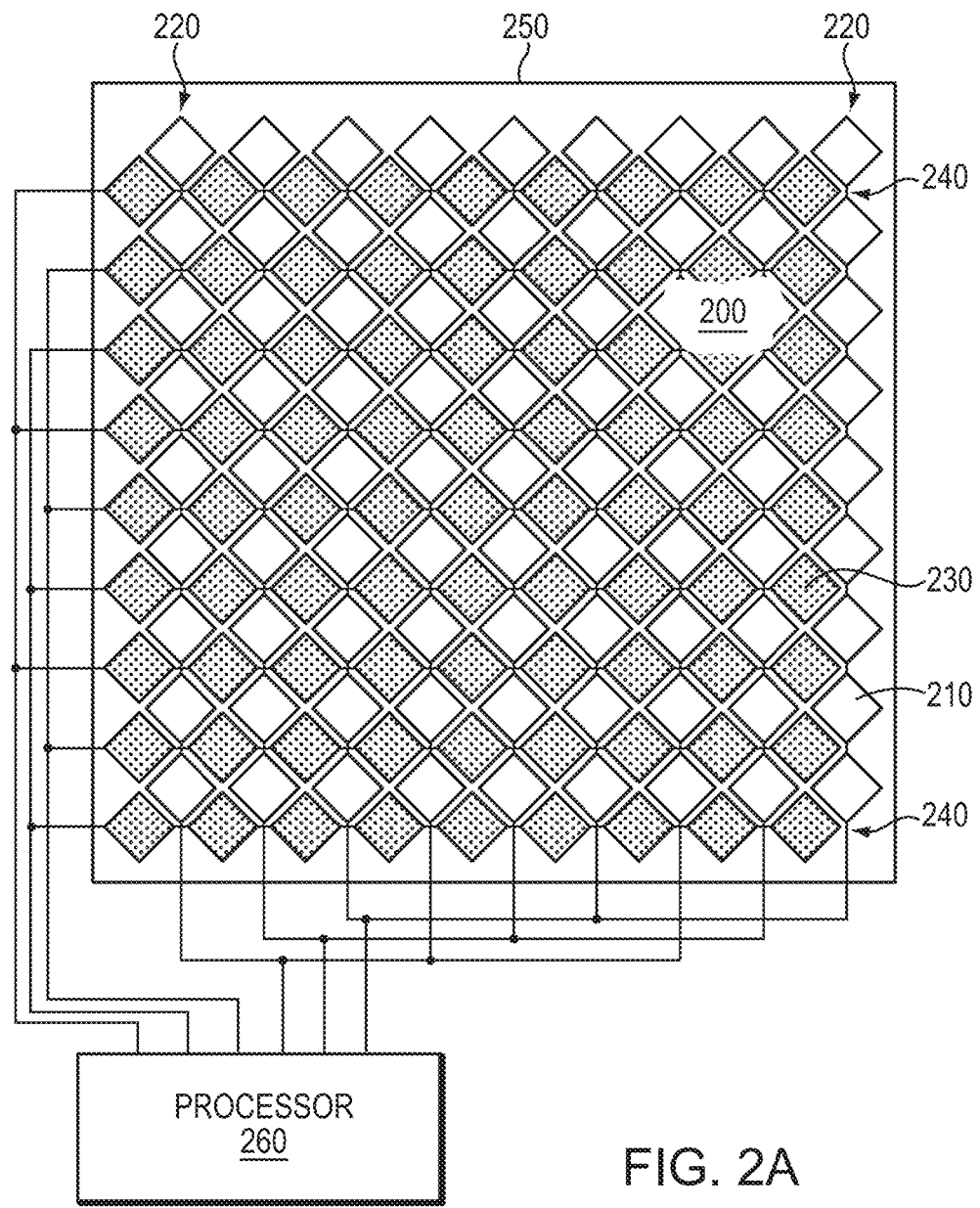
FIG. 2A is a plan-view schematic of the sensor array of a touch-panel display.
Figure 2B:
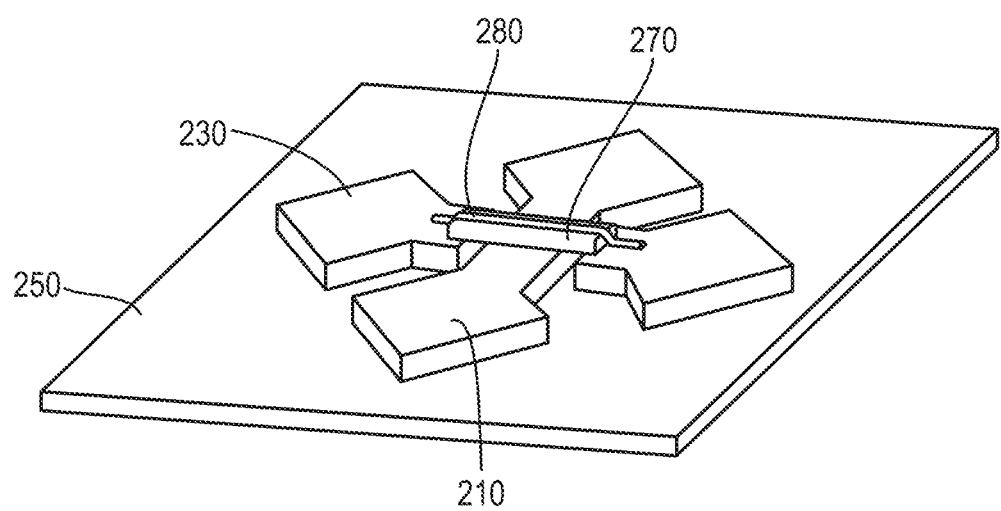
FIG. 2B is a magnified perspective view of a portion of the sensor array of FIG. 2A.
Figure 2C:
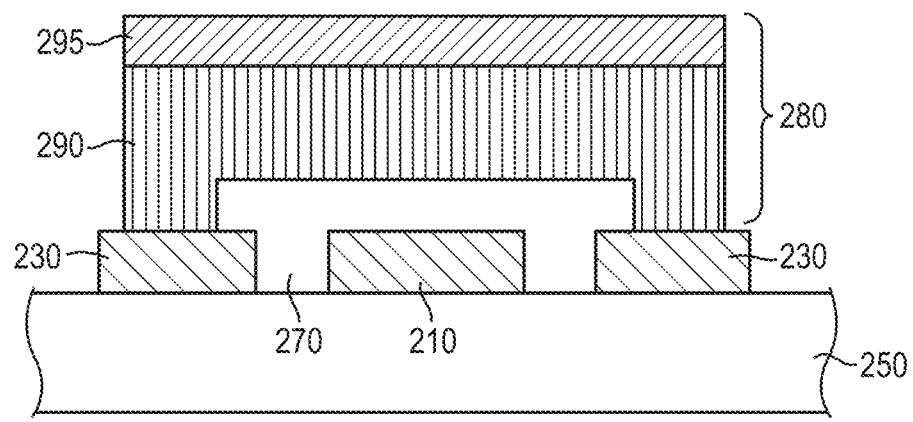
FIG. 2C is a schematic cross-section of the sensor-array portion of FIG. 2B.
Figure 2D:
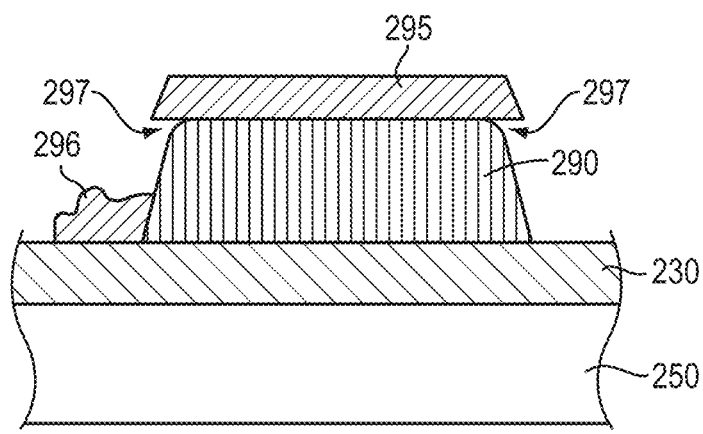
FIG. 2D is a schematic cross-section, along a plane perpendicular to that of FIG. 2C, of the sensor-array portion of FIG. 2B depicting an etched conventional interconnect.
Figure 3:
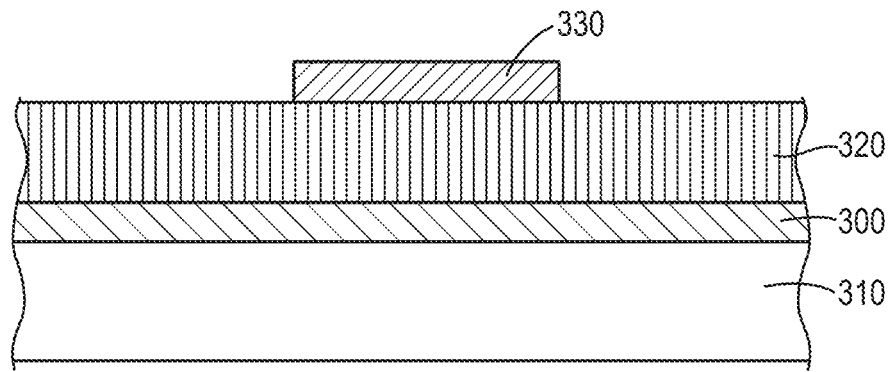
FIGS. 3 and 4 are schematic cross-sections of a TFT electrode during fabrication in accordance with various embodiments of the invention.

FIG. 3 depicts an initial step in the fabrication of a TFT gate electrode in accordance with embodiments of the present invention. As shown, a barrier layer 300 is deposited on a substrate 310 (e.g., a glass or silicon substrate) by, e.g., sputtering or other physical deposition process. A conductor layer 320 is subsequently deposited on the barrier layer 300 by, e.g., sputtering or other physical deposition process. Typically the thickness of the barrier layer 300 will be between approximately 5% and approximately 25% (e.g., approximately 10%) of the thickness of conductor layer 320. For example, the thickness of the barrier layer 300 may be approximately 50 nm, and the thickness of the conductor layer 320 may be approximately 500 nm. A mask layer 330 (e.g., photoresist) is formed over the conductor layer 320 and patterned by conventional photolithography.

Figure 4:
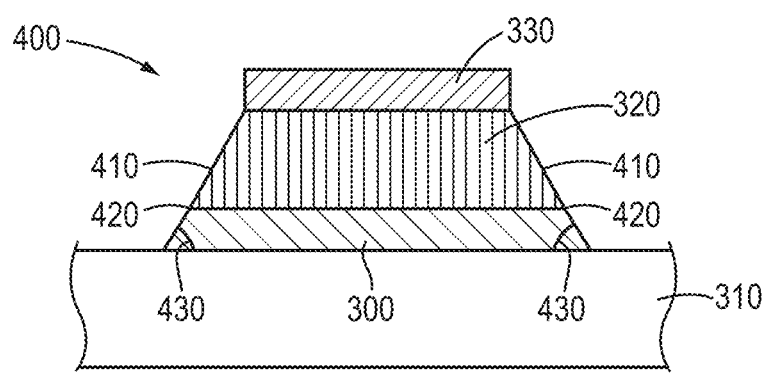

As shown in FIG. 4, a gate electrode 400 is then fabricated by etching the portions of the conductor layer 320 and barrier layer 300 not covered by the mask layer 330, preferably in a single-step wet etch. A wet etchant (e.g., a PAN etch) is utilized to etch away the metal layers at substantially the same rates, resulting in sidewalls 410 that are substantially smooth and/or linear and that are substantially free of any discontinuity (e.g., a stepped or nonlinear profile) at an interface 420 between the conductor layer 320 and barrier layer 300. The wet etchant may include or consist essentially of, for example, a PAN etch including or consisting essentially of 50-60 weight % phosphoric acid, 15-25 weight % acetic acid, 3-5 weight % nitric acid, and the balance DI water. Some specific examples are provided in the table below. In one preferred embodiment, the wet etchant includes or consists essentially of 50 weight % phosphoric acid, 25 weight % acetic acid, 3 weight % nitric acid, and the balance (22 weight %) DI water.

|  | phosphoric acid, H3PO4 (wt %) | nitric acid, HNO3 (wt %) | acetic acid, CH3COOH (wt %) | DI water, balance (wt %) |
| --- | --- | --- | --- | --- |
| etchant 1 | 50 | 5 | 15 | 30 |
| etchant 2 | 60 | 5 | 20 | 15 |
| etchant 3 | 50 | 3 | 25 | 22 |

After etching, the substrate 310 (as well as the electrode 400) is preferably substantially free of etch residue of one or both of the conductor layer 320 and the barrier layer 300 in regions proximate the gate electrode 400. In accordance with various embodiments of the invention, the wet-etching process is performed at room temperature. The wet etchant may be sprayed on the substrate 310, or the substrate 310 may be partially or completely immersed in the wet etchant. The wet-etching process may be performed as a batch (i.e., multiple-substrate) process or as a single-substrate process. In preferred embodiments, after etching the sidewalls 410 form an angle 430 with the surface of the underling substrate 310 of between approximately 50° and approximately 70°, e.g., approximately 60°. After etching, the mask layer 330 may be removed by conventional means, e.g., acetone, a commercial photoresist stripping agent, and/or exposure to an oxygen plasma.

Figure 5:
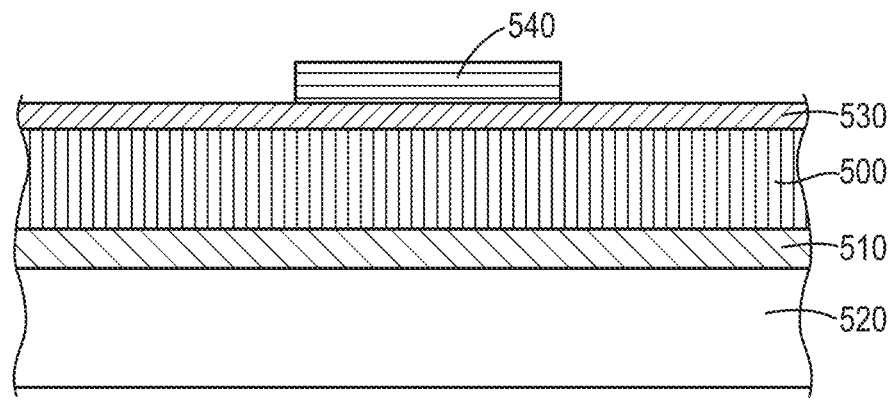
FIGS. 5 and 6 are schematic cross-section of an interconnect for a touch-panel display in accordance with various embodiments of the invention.

FIG. 5 depicts an initial step in the fabrication of a touch-panel sensor interconnect in accordance with embodiments of the present invention. As shown, a conductive layer 500 is deposited over a sensor 510 (e.g., a row or column sensor that may be composed of a transparent conductor such as ITO) on a substrate 520 (e.g., a glass or silicon substrate) by, e.g., sputtering or other physical deposition process. A capping layer 530 is subsequently deposited on the conductive layer 500 by, e.g., sputtering or other physical deposition process. Typically the thickness of the capping layer 530 will be between approximately 5% and approximately 25% (e.g., approximately 10%) of the thickness of conductive layer 500. For example, the thickness of the capping layer 530 may be approximately 50 nm, and the thickness of the conductive layer 500 may be approximately 500 nm. A mask layer 540 (e.g., photoresist) is formed over the capping layer 530 and patterned by conventional photolithography.

Figure 6:
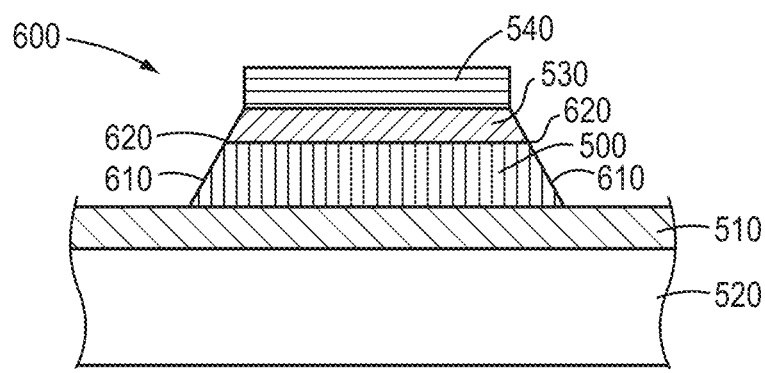

As shown in FIG. 6, an interconnect 600 is then fabricated by etching the portions of the capping layer 530 and conductive layer 500 not covered by the mask layer 540, preferably in a single-step wet etch. A wet etchant (e.g., a PAN etch) is utilized to etch away the metal layers at substantially the same rates, resulting in sidewalls 610 that are substantially smooth and/or linear and that are substantially free of any discontinuity (e.g., a stepped or nonlinear profile) at an interface 620 between the capping layer 530 and conductive layer 500. The wet etchant may include or consist essentially of, for example, a PAN etch including or consisting essentially of 50-60 weight % phosphoric acid, 15-25 weight % acetic acid, 3-5 weight % nitric acid, and the balance DI water. In one preferred embodiment, the wet etchant includes or consists essentially of 50 weight % phosphoric acid, 25 weight % acetic acid, 3 weight % nitric acid, and the balance (22 weight %) DI water.

After etching, the substrate 520 and electrode 510 (as well as the interconnect 600) are preferably substantially free of etch residue of one or both of the capping layer 530 and the conductive layer 500 in regions proximate the interconnect 600. In accordance with various embodiments of the invention, the wet-etching process is performed at room temperature. The wet etchant may be sprayed on the substrate 520, or the substrate 520 may be partially or completely immersed in the wet etchant. The wet-etching process may be performed as a batch (i.e., multiple-substrate) process or as a single-substrate process. In preferred embodiments, after etching the sidewalls 610 form an angle 630 with the surface of the underling substrate 520 of between approximately 50° and approximately 70°, e.g., approximately 60°. After etching, the mask layer 330 may be removed by conventional means, e.g., acetone, a commercial photoresist stripping agent, and/or exposure to an oxygen plasma.

Figure 7A:
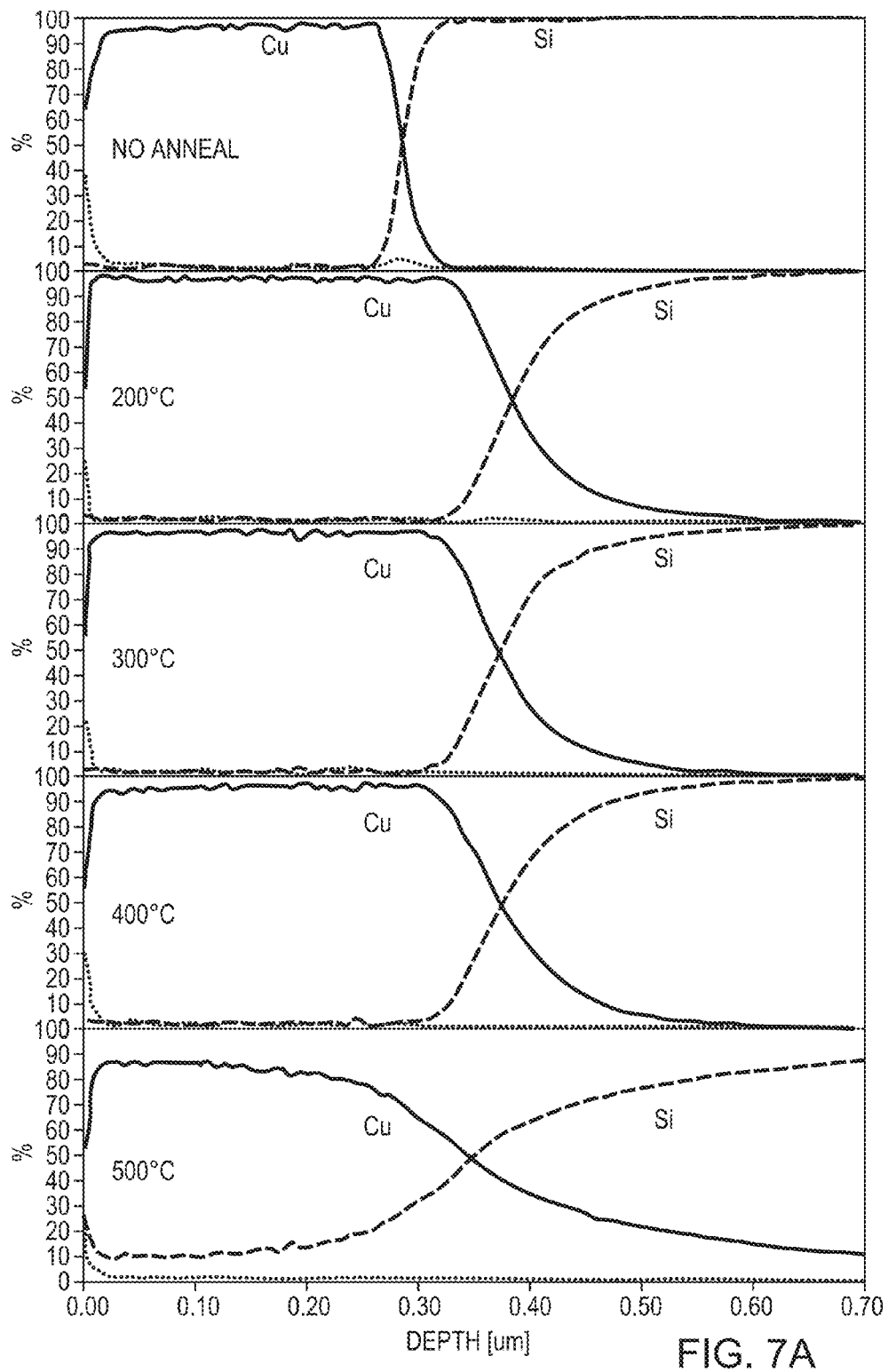
FIGS. 7A and 7B are Auger spectra graphs of mutual diffusion of Cu and Si without a diffusion barrier therebetween.
Figure 7B:
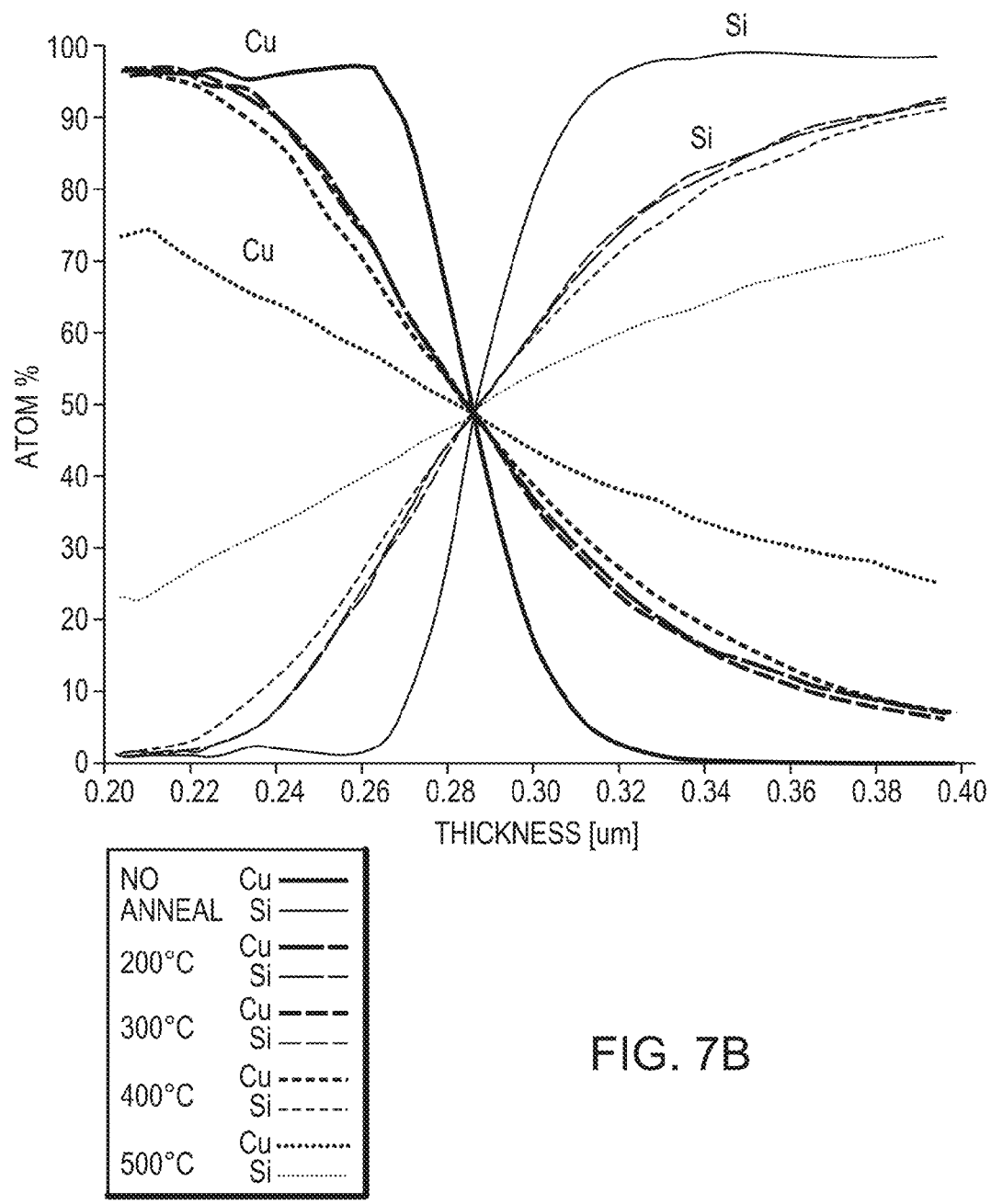

Barrier layers 300 and capping layers 530 in accordance with various embodiments of the invention also serve as effective diffusion barriers for metallic layers that include or consist essentially of, e.g., Cu, Ag, Al, or Au. Specifically, the alloying element(s) within the barrier layer 300 and/or capping layer 530 substantially prevent diffusion of a conductor layer material (e.g., Cu) into an underlying silicon substrate or an adjoining layer even after exposure to elevated temperatures (e.g., up to approximately 200° C., up to approximately 350° C., up to approximately 500° C., or even higher) for times of, e.g., up to 2 hours. FIGS. 7A and 7B show the concentrations of Cu and silicon across a Cu/silicon interface (i.e., one without a barrier layer between the Cu and silicon) as measured with Auger electron spectroscopy (AES) as fabricated (no anneal) and after anneals of 200° C.-500° C. As shown, mutual diffusion of the Cu and silicon occurs at temperatures as low as (or even lower than) 200° C., and the interface is severely diffused after an anneal at 500° C. Additionally, the Cu layer exhibits poor adhesion to silicon in the absence of a barrier layer between the Cu and silicon.

Figure 8A:
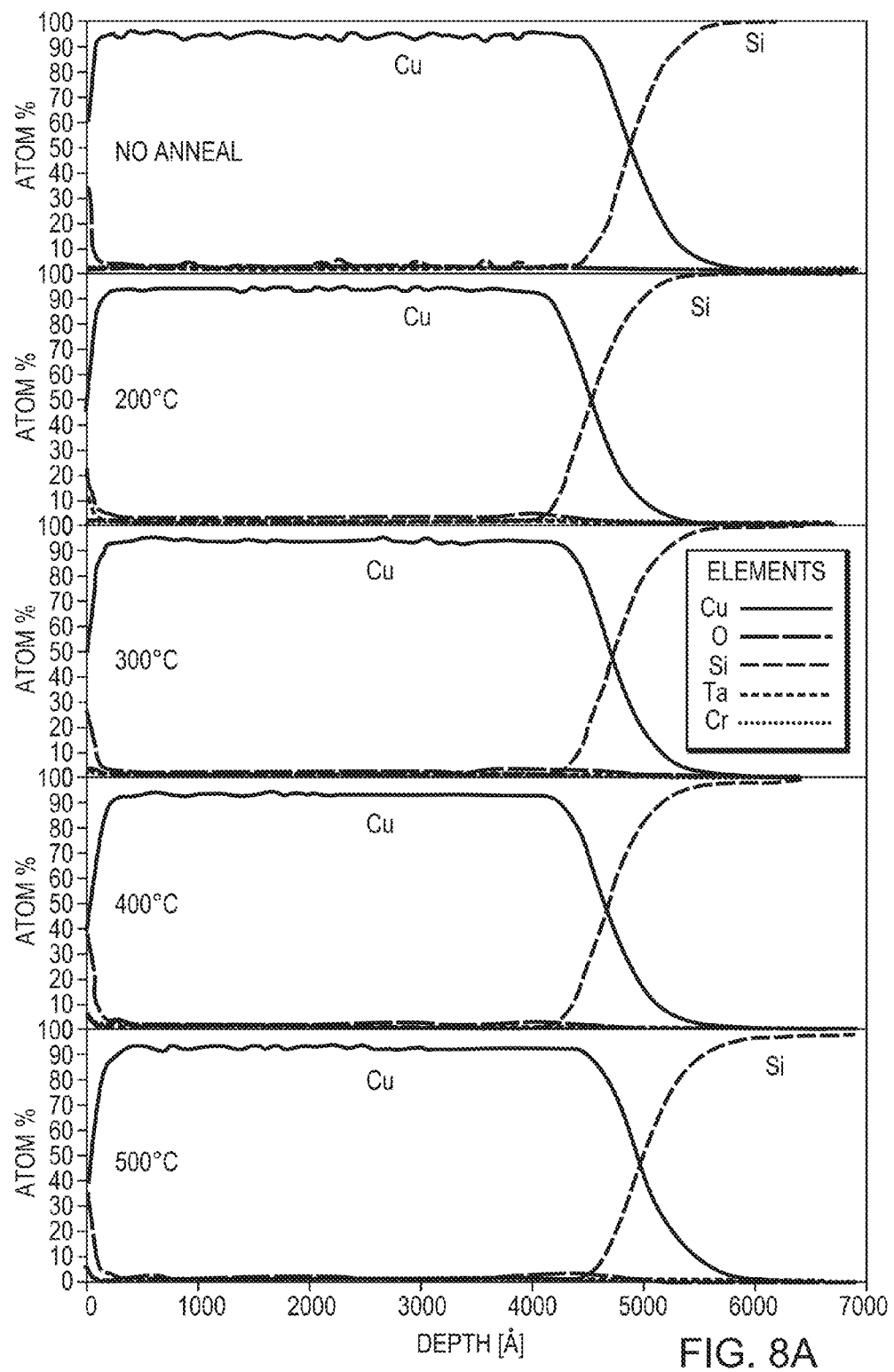
FIGS. 8A and 8B are Auger spectra graphs of mutual diffusion of Cu and Si between a Si layer and a Cu-alloy capping or barrier layer in accordance with various embodiments of the invention.
Figure 8B:
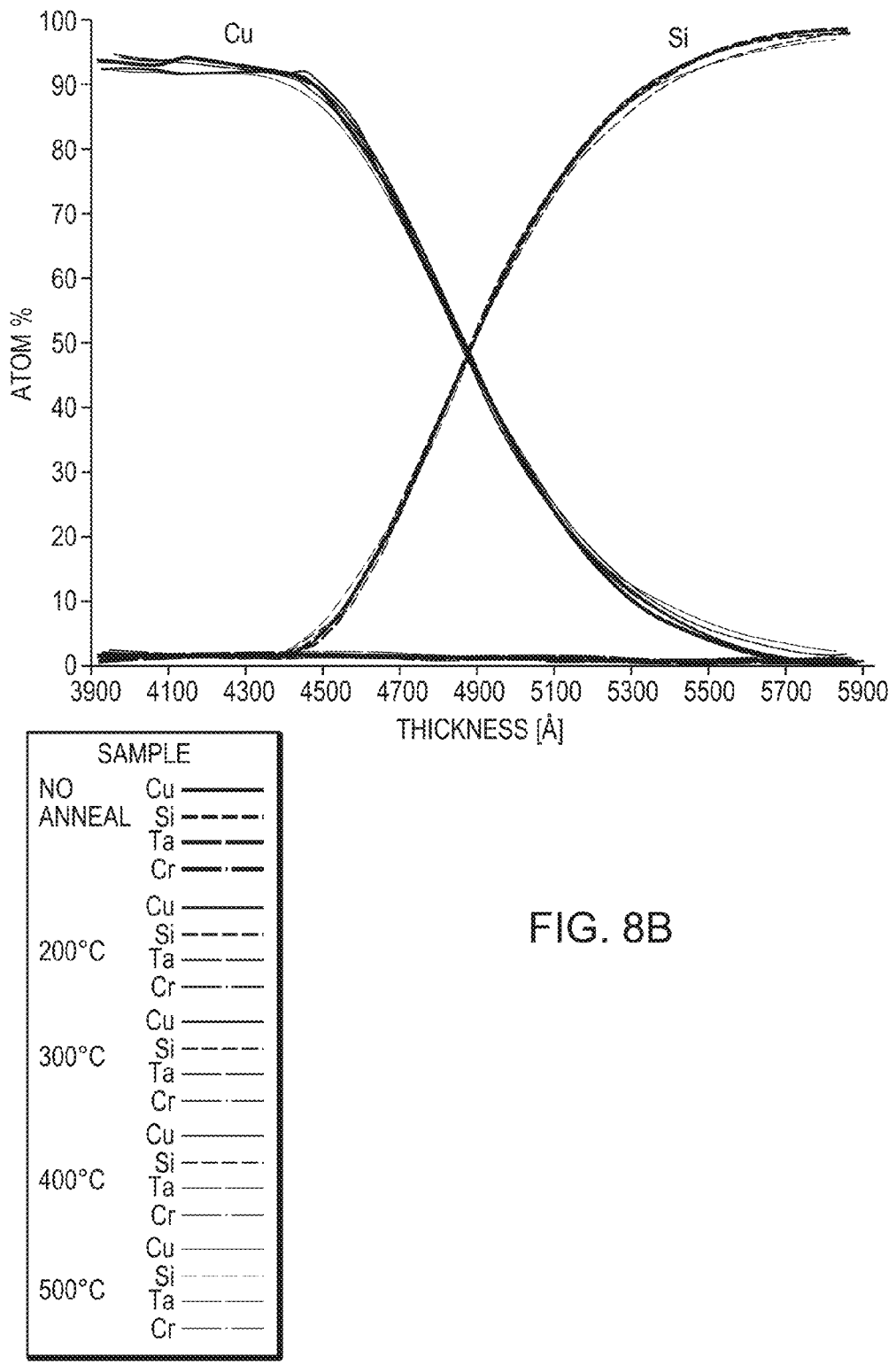
Figure 9A:
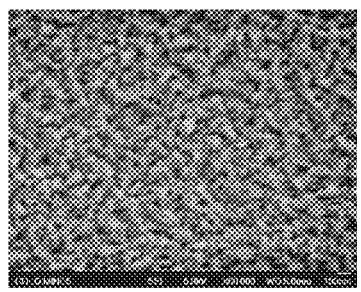
FIGS. 9A-9C are plan-view micrographs of the surface of a Cu-alloy capping or barrier layer as deposited (FIG. 9A), after annealing at 300° C.
Figure 9B:
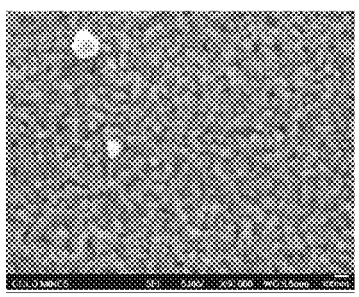
Figure 9C:
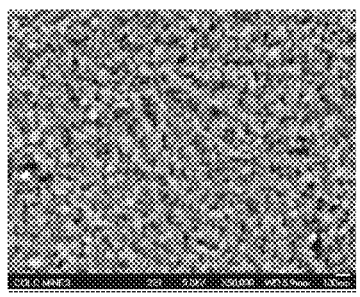

FIGS. 8A and 8B show the concentrations of Cu and silicon across an interface between silicon and a barrier layer 300 or capping layer 530 that includes or consists essentially of CuTaCr as measured with AES after no anneal and anneals of 200° C.-500° C. In the illustrated embodiment, the barrier layer 300 or capping layer 530 is composed of 2 weight % Ta, 1 weight % Cr, and the balance Cu. (In another embodiment exhibiting similar behavior, the barrier layer 300 or capping layer 530 includes or consists essentially of 5 weight % Ta, 2 weight % Cr, and the balance Cu.) In contrast to the results shown in FIGS. 7A and 7B, there is negligible diffusion of Cu or silicon across the interface, even after an anneal at 500° C. for two hours. FIGS. 9A-9C are a series of scanning electron microscopy (SEM) micrographs of the surface of the barrier layer 300 or capping layer 530 as deposited (FIG. 9A), after an anneal of 300° C. for one hour (FIG. 9B), and after an anneal of 500° C. for one hour (FIG. 9C). As shown, the grain structure and size of the barrier layer 300 or capping layer 530 show no appreciable change, and there is no evidence of the formation of different phases (e.g., copper silicide phases) even after a heat treatment of 500° C. These results were confirmed by x-ray diffraction (XRD) scans of annealed structures, in which no silicide phases were detected even after anneals of 500° C. for two hours. In contrast, copper silicide phases are clearly evident in SEM and XRD performed on samples of pure Cu layers on Si that have been annealed at 500° C. for two hours.

Figure 10A:
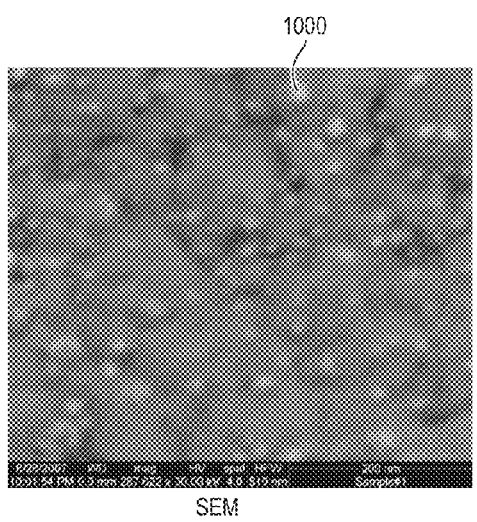
FIGS. 10A and 10B are plan-view micrographs taken via scanning electron microscopy (FIG. 10A) and transmission electron microscopy (FIG. 10B) of an annealed Cu-alloy capping or barrier layer on Si, in accordance with various embodiments of the invention.
Figure 10B:
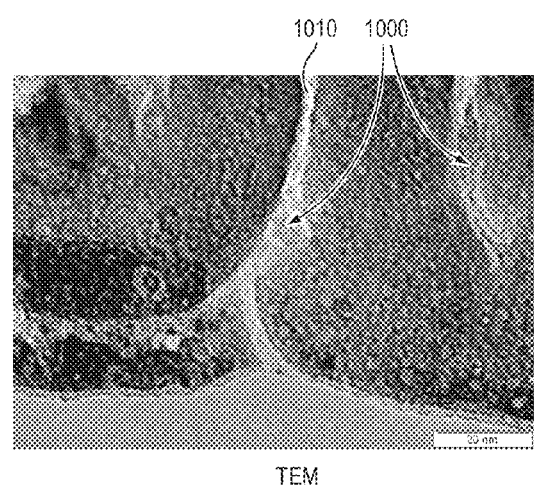

FIGS. 10A and 10B show, respectively, SEM and transmission electron microscopy (TEM) images of a barrier layer 300 or capping layer 530 that is disposed in contact with silicon (e.g., a silicon substrate and/or a silicon overlayer) and that has been annealed at 350° C. for 30 minutes. Precipitates 1000 are evident within the Cu grain boundaries 1010 of the barrier layer 300 or capping layer 530. In various embodiments the precipitates include or consist essentially of a silicide of one or more of the refractory metal alloying elements of the barrier layer 300 or capping layer 530, and such precipitates reduce or substantially eliminate Cu diffusion along the grain boundaries into the adjoining silicon.

Similarly, in various embodiments of the invention, the refractory-metal dopants of barrier layers 300 and/or capping layers 530 tend to segregate to the Cu grain boundaries and provide beneficial effects even in the absence of reaction with silicon to form silicides. For example, the Cu grain boundaries may be occupied, and partially or substantially completely "blocked" with the refractory-metal dopants and thereby retard or substantially prevent oxygen diffusion along the Cu grain boundaries. In this manner, corrosion of the barrier layer 300, capping layer 530, and/or the conductive layer in contact therewith is decreased or substantially prevented. Thus, in various embodiments of the present invention, a barrier layer 300 or capping layer 530 may include or consist essentially of a polycrystalline Cu matrix doped with one or more refractory metal elements, where the grain boundaries of the layer between the doped Cu grains contain a higher concentration of the refractory metal dopant(s) that the concentration within the grains themselves. For example, the refractory metal concentration within the grain boundaries may be larger than that within the grains by a factor of 5, a factor of 10, or even a factor of 100.

Figure 11:
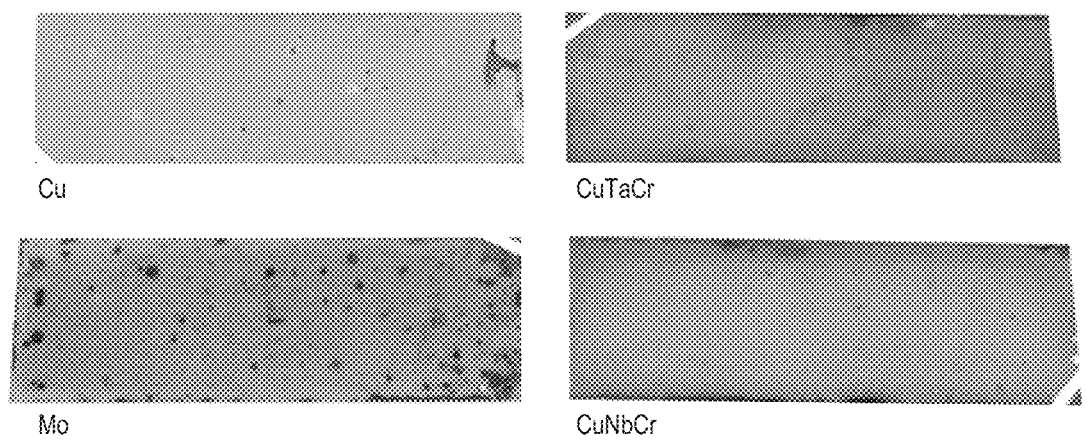
FIG. 11 depicts corrosion levels after environmental corrosion testing of samples of pure Mo, pure Cu, CuTaCr alloy, and CuNbCr alloy in accordance with various embodiments of the invention.

FIG. 11 depicts images of four different metallic samples after an environmental corrosion test conducted at 60° C. and 80% humidity for a period of 260 hours. As shown, the samples of pure Cu and pure Mo experienced much more severe corrosion that did the Cu-alloy samples in accordance with embodiments of the present invention. The two Cu-alloy samples were (1) Cu with 10 weight % Ta and 2 weight % Cr (labeled in FIG. 11 as CuTaCr), and (2) Cu with 5 weight % Nb and 2 weight % Cr (labeled in FIG. 11 as CuNbCr). The table below provides data regarding the amount of exposed surface area corroded during the environmental corrosion test for each of the samples. As indicated, the Cu-alloy samples in accordance with embodiments of the present invention experienced much less corrosion than the pure Cu and Mo samples, demonstrating the benefits of such alloys over conventional Mo diffusion barriers and capping layers, as well as over pure Cu.

| Sample | Corroded Surface Area (%) |
|---|---|
| Mo | 6.78 |
| Cu | 3.84 |
| CuTaCr | 1.75 |
| CuNbCr | 0.83 |

In preferred embodiments of the invention, the barrier layers 300 or capping layers 530 have low resistivity, e.g., below 10 microOhm-cm, or even below 5 microOhm-cm, even after anneals of up to 500° C., up to 600° C., or even higher temperatures. Moreover, in preferred embodiments the barrier layers 300 or capping layers 530 exhibit good adhesion to glass as measured by, e.g., an ASTM standard tape test. Embodiments of the invention also include electronic devices (or portions thereof) in which a highly conductive material (e.g., Cu, Ag, Al, and/or Au) is utilized to form all or a portion of a conductor or electrode and has both a barrier layer 300 below it and a capping layer 530 above it.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming an electrode of a thin-film transistor, the method comprising:
   providing a substrate comprising at least one of silicon or glass;
   depositing over the substrate a barrier layer consisting essentially of at least one metal, the at least one metal comprising an alloy of Cu and one or more refractory metal elements selected from the group consisting of Ta, Nb, Mo, W, Zr, Hf, Re, Os, Ru, Rh, Ti, V, Cr, and Ni;
   depositing over the barrier layer a conductor layer comprising at least one of Cu, Ag, Al, or Au;
   forming a mask layer over the barrier layer;
   patterning the mask layer to reveal a portion of the conductor layer, a remaining portion of the mask layer at least partially defining a shape of the electrode; and
   thereafter, applying an etchant to remove portions of the conductor layer and the barrier layer not masked by the patterned mask layer, thereby forming a sidewall of the electrode:
comprising (i) an exposed portion of the barrier layer, (ii) an exposed portion of the conductor layer, and (iii) an interface between the exposed portion of the barrier layer and the exposed portion of the conductor layer, and
substantially free of discontinuities notwithstanding the interface.

2. The method of claim 1, wherein the mask layer comprises photoresist.

3. The method of claim 1, wherein the etchant comprises a mixture of phosphoric acid, acetic acid, nitric acid, and water.

4. The method of claim 1, wherein the etchant consists essentially of 50-60 weight % phosphoric acid, 15-25 weight % acetic acid, 3-5 weight % nitric acid, and the balance water.

5. The method of claim 1, wherein the etchant consists essentially of 50 weight % phosphoric acid, 25 weight % acetic acid, 3 weight % nitric acid, and the balance water.

6. The method of claim 1, further comprising removing the remaining portion of the patterned mask layer.

7. The method of claim 1, wherein (i) the barrier layer comprises a plurality of crystalline grains separated by grain boundaries, and (ii) the substrate comprises silicon.

8. The method of claim 7, further comprising forming a particulate within at least one of the grain boundaries at least in part by annealing the electrode at a temperature sufficient to form the particulate, the particulate comprising a reaction product of silicon and at least one of the refractory metal elements.

9. The method of claim 1, wherein the substrate comprises glass.

10. The method of claim 1, wherein the substrate comprises silicon.

11. The method of claim 10, wherein the substrate comprises amorphous silicon.

12. The method of claim 1, wherein the barrier layer comprises an alloy of Cu, Ta, and Cr.

13. The method of claim 12, wherein the barrier layer consists essentially of 1 weight % - 12 weight % Ta, 1 weight % - 5 weight % Cr, and the balance Cu.

14. The method of claim 12, wherein the barrier layer consists essentially of approximately 5 weight % Ta, approximately 2 weight % Cr, and the balance Cu.

15. The method of claim 12, wherein the barrier layer consists essentially of approximately 2 weight % Ta, approximately 1 weight % Cr, and the balance Cu.

16. The method of claim 1, wherein the barrier layer comprises an alloy of Cu, Ta, and Ti.

17. The method of claim 16, wherein the barrier layer consists essentially of 1 weight % - 12 weight % Ta, 1 weight % - 5 weight % Ti, and the balance Cu.

18. The method of claim 16, wherein the barrier layer consists essentially of approximately 5 weight % Ta, approximately 2 weight % Ti, and the balance Cu.

19. The method of claim 1, wherein the barrier layer comprises an alloy of Cu, Nb, and Cr.

20. The method of claim 19, wherein the barrier layer consists essentially of 1 weight % - 10 weight % Nb, 1 weight % - 5 weight % Cr, and the balance Cu.

21. The method of claim 19, wherein the barrier layer consists essentially of approximately 5 weight % Nb, approximately 2 weight % Cr, and the balance Cu.

22. The method of claim 1, wherein:
   the barrier layer comprises a plurality of crystalline grains separated by grain boundaries; and
   a concentration of the one or more refractory metal elements within the grain boundaries is larger than a concentration of the one or more refractory metal elements within the crystalline grains.

* * * * *